(12) United States Patent
Chen et al.

(10) Patent No.: US 12,417,964 B2
(45) Date of Patent: Sep. 16, 2025

(54) VIA-FILLING METHOD OF THROUGH-GLASS VIA SUBSTRATE

(71) Applicant: Ingentec Corporation, Zhunan Township, Miaoli County (TW)

(72) Inventors: Hsiao Lu Chen, Zhunan Township (TW); Ai Sen Liu, Zhunan Township (TW); Hsiang An Feng, Zhunan Township (TW); Ya Li Chen, Zhunan Township (TW)

(73) Assignee: INGENTEC CORPORATION, Zhunan Township, Miaoli County (TW)

( * ) Notice: Subject to any disclaimer, the term of this patent is extended or adjusted under 35 U.S.C. 154(b) by 418 days.

(21) Appl. No.: 18/106,769

(22) Filed: Feb. 7, 2023

(65) Prior Publication Data
US 2024/0071872 A1 Feb. 29, 2024

(30) Foreign Application Priority Data
Aug. 31, 2022 (TW) ................ 111133007

(51) Int. Cl.
*H01L 23/48* (2006.01)
*H01L 21/48* (2006.01)

(52) U.S. Cl.
CPC ........ *H01L 23/481* (2013.01); *H01L 21/4853* (2013.01); *H01L 21/486* (2013.01)

(58) Field of Classification Search
CPC . H01L 23/481; H01L 21/4853; H01L 21/486; H01L 23/49827; H01L 23/49838; H01L 23/15; H01L 21/76877
See application file for complete search history.

(56) References Cited

U.S. PATENT DOCUMENTS

| | | | | |
|---|---|---|---|---|
| 5,240,671 A | * | 8/1993 | Carey | C04B 41/4578 |
| | | | | 264/633 |
| 7,772,123 B2 | * | 8/2010 | Birner | H01L 21/76877 |
| | | | | 257/E21.585 |
| 9,305,866 B2 | * | 4/2016 | Lu | H01L 23/49894 |
| 9,379,043 B1 | * | 6/2016 | Wang | H01L 21/76898 |
| 10,756,009 B1 | * | 8/2020 | Hoffmeyer | H05K 3/308 |
| 2011/0266671 A1 | * | 11/2011 | Youm | H01L 23/49827 |
| | | | | 257/738 |
| 2021/0125897 A1 | * | 4/2021 | Valavala | H10N 19/00 |

FOREIGN PATENT DOCUMENTS

| | | | | | |
|---|---|---|---|---|---|
| BR | 9404248 A | * | 6/1995 | ......... | B23K 1/0008 |
| DE | 19608683 A1 | * | 9/1997 | ......... | B23K 35/0222 |
| EP | 1387401 A2 | * | 2/2004 | ............ | H01L 21/44 |
| FR | 3007199 A1 | * | 12/2014 | ....... | H01L 23/49827 |
| KR | 20130030988 A | * | 3/2013 | ............. | H05K 3/421 |
| WO | WO-9853494 A1 | * | 11/1998 | ......... | H01L 21/4814 |
| WO | WO-2011136403 A1 | * | 11/2011 | ....... | H01L 23/49827 |

* cited by examiner

*Primary Examiner* — Mohammed Shamsuzzaman
(74) *Attorney, Agent, or Firm* — Birch, Stewart, Kolasch & Birch, LLP (57) ABSTRACT

A via-filling method of a TGV substrate includes steps: filling a plurality of metal balls into a plurality of vias of the TGV substrate; using a heating process to melt the plurality of metal balls to form a liquid-state metal; and cooling down the liquid-state metal to form a solid-state metal inside the plurality of vias. Because the method needn't use solvents or fluxes, the solid-state metal inside the plurality of vias have better electric conductivity.

8 Claims, 9 Drawing Sheets

VIA-FILLING METHOD OF THROUGH-GLASS VIA SUBSTRATE

This application claims priority of application Ser. No. 11/133,007 filed in Taiwan on 31 Aug. 2022 under 35 U.S.C. § 119; the entire contents of all of which are hereby incorporated by reference.

BACKGROUND OF THE INVENTION

Field of the Invention

The present invention relates to a Through-Glass Via (TGV) technology, particularly to a via-filling method of a TGV substrate.

Description of the Prior Art 3D package technology has been extensively developed in recent years. In a 3D package structure, a TGV substrate is usually used as an interposer to electrically connect an upper chip above the TGV substrate with a lower chip below the TGV substrate. The interposer may also be called the intervening layer or the intermediate layer. The upper chip is electrically connected with the lower chip through a solid-state metal inside a plurality of vias of the TGV substrate. The current via-filling methods of the TGV substrate include using a printing method to fill a metal paste into a plurality of vias of the TGV substrate, and then sintering the metal paste to form a solid-state metal inside the plurality of vias. In the traditional via-filling technology, a solvent or a flux is added to the metal paste to keep the flowability of the metal paste and make the metal paste filled easily. However, the solvent and flux are less likely to vaporize. Thus, pores may appear inside the sintered solid-state metal and lead to poor electric conductivity.

SUMMARY OF THE INVENTION

The present invention provides a via-filling method of a TGV substrate for enhancing the electric conductivity.

In one embodiment, a via-filling method of a TGV substrate of the present invention comprises Step A: coating a release agent on the upper surface of a fixture; Step B: placing the TGV substrate on the upper surface of the fixture, wherein the TGV substrate has a plurality of vias; Step C: filling a plurality of metal balls into the plurality of vias; Step D: melting the plurality of metal balls to form a liquid-state metal; Step E: cooling the liquid-state metal inside the plurality of vias to generate a solid-state metal; Step F: repeating Steps C-E until the plurality of vias is fully filled by the solid-state metal; and Step G: cleaning the surface of the TGV substrate, and removing the TGV substrate from the fixture.

In comparison with the conventional via-filling technology using a metal paste, the present invention needn't use a solvent or a flux. Therefore, the solid-state metal inside the vias is free of pores and has better electric conductivity.

DETAILED DESCRIPTION OF THE INVENTION

Figure 1:
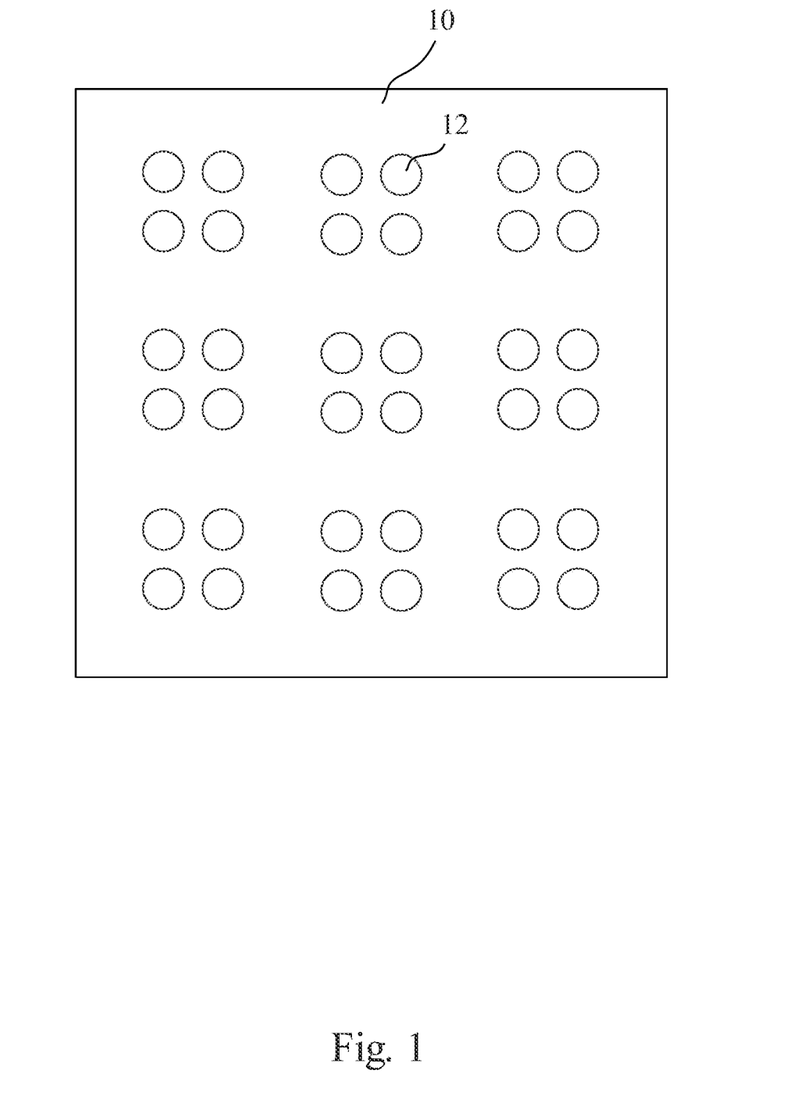
FIG. 1 is a top view schematically showing a TGV substrate where vias have not been filled yet according to one embodiment of the present invention.
Figure 2:
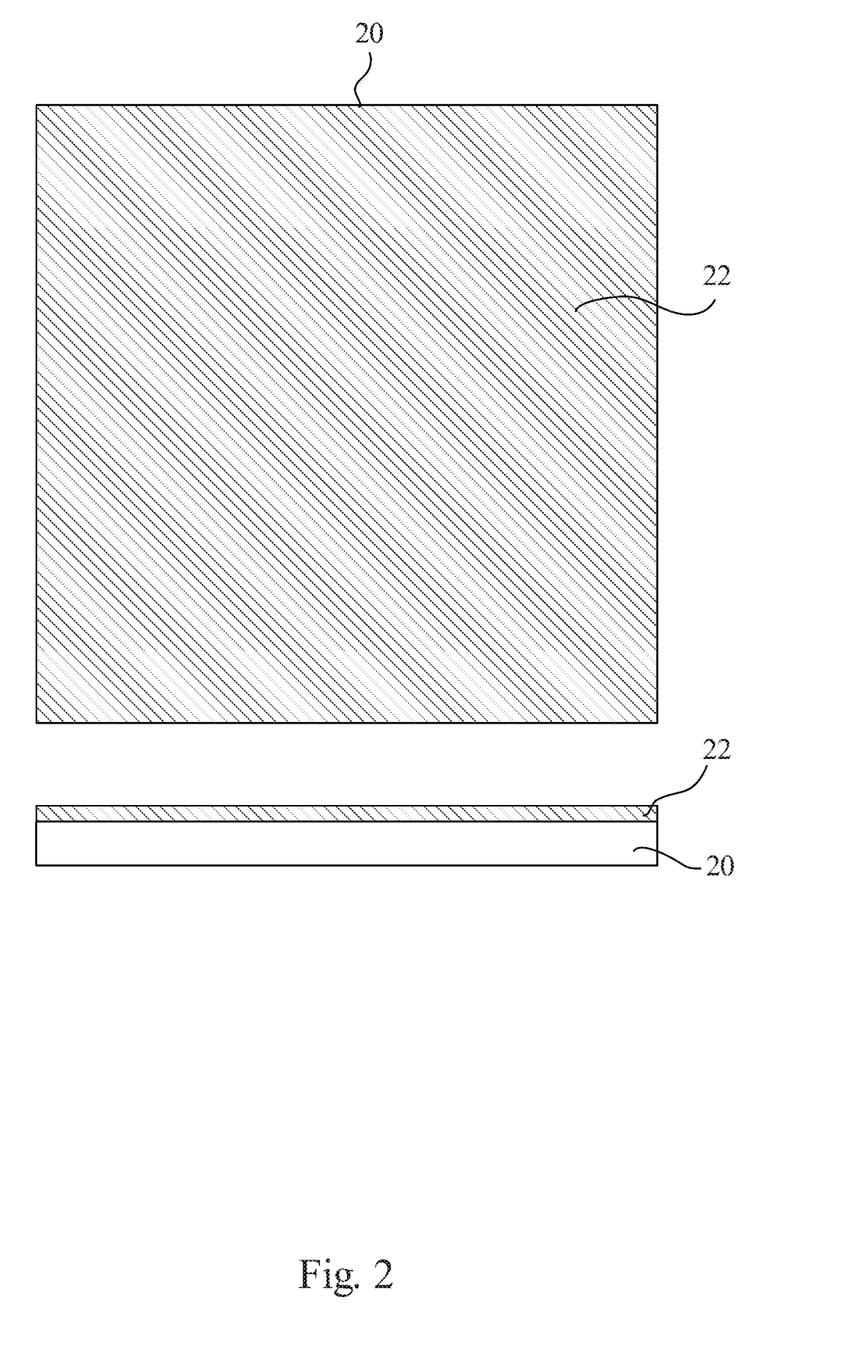
FIG. 2 includes a top view and a sectional view schematically showing a fixture according to one embodiment of the present invention.
Figure 3:
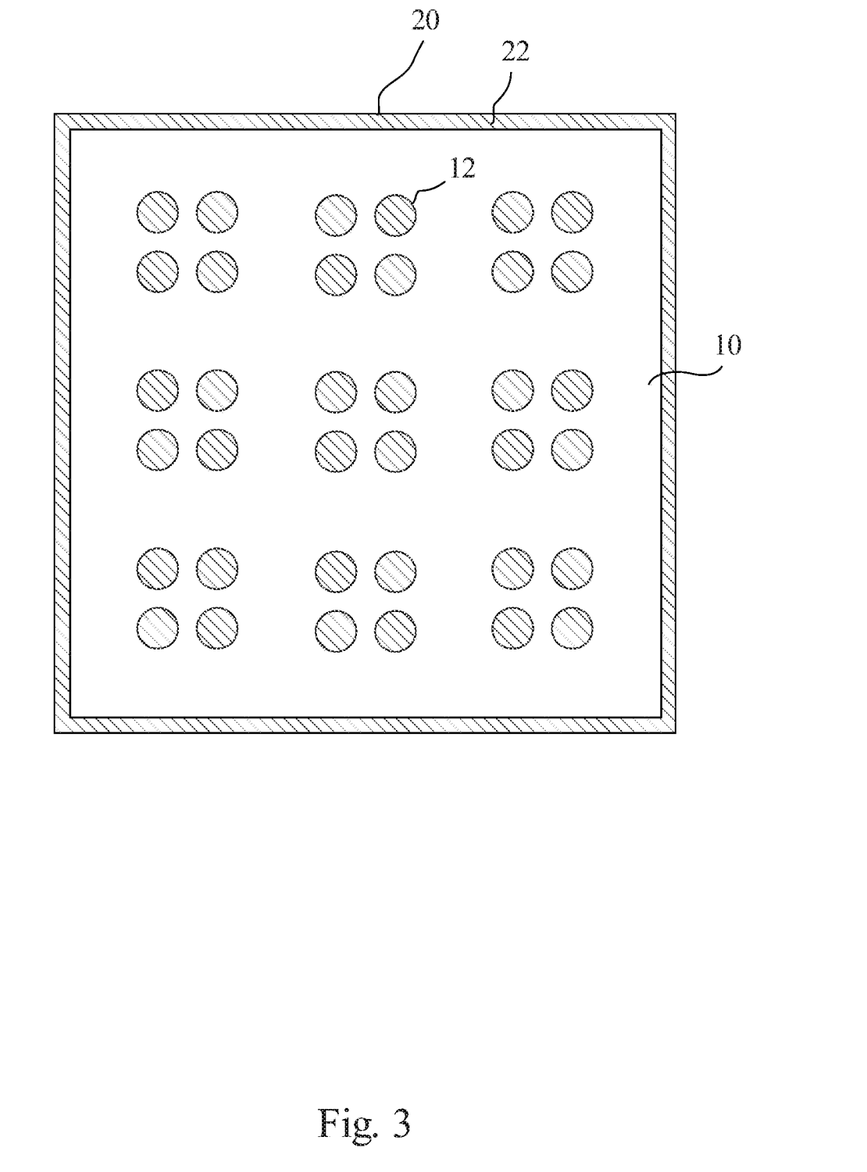
FIG. 3 is a diagram schematically showing that a TGV substrate is placed on a fixture according to one embodiment of the present invention.

FIGS. 1-8 are used to demonstrate the via-filling method of a TGV substrate according to one embodiment of the present invention. Firstly, acquire a TGV substrate 10, which has a plurality of vias 12 interconnecting the upper surface and the lower surface of the TGV substrate 10, as shown in FIG. 1. Next, coat a heat-resistant release agent 22 on the upper surface of a fixture 20, wherein the release agent 22 makes the TGV substrate 10 removed from the fixture 20 more easily, as shown in FIG. 2. In FIG. 2, the upper drawing is a top view of the fixture 20, and the lower drawing is a sectional view of the fixture 20. After the release agent 22 has been coated, place the TGV substrate 10 on the upper surface of the fixture 20, as shown in FIG. 3.

Figure 4:
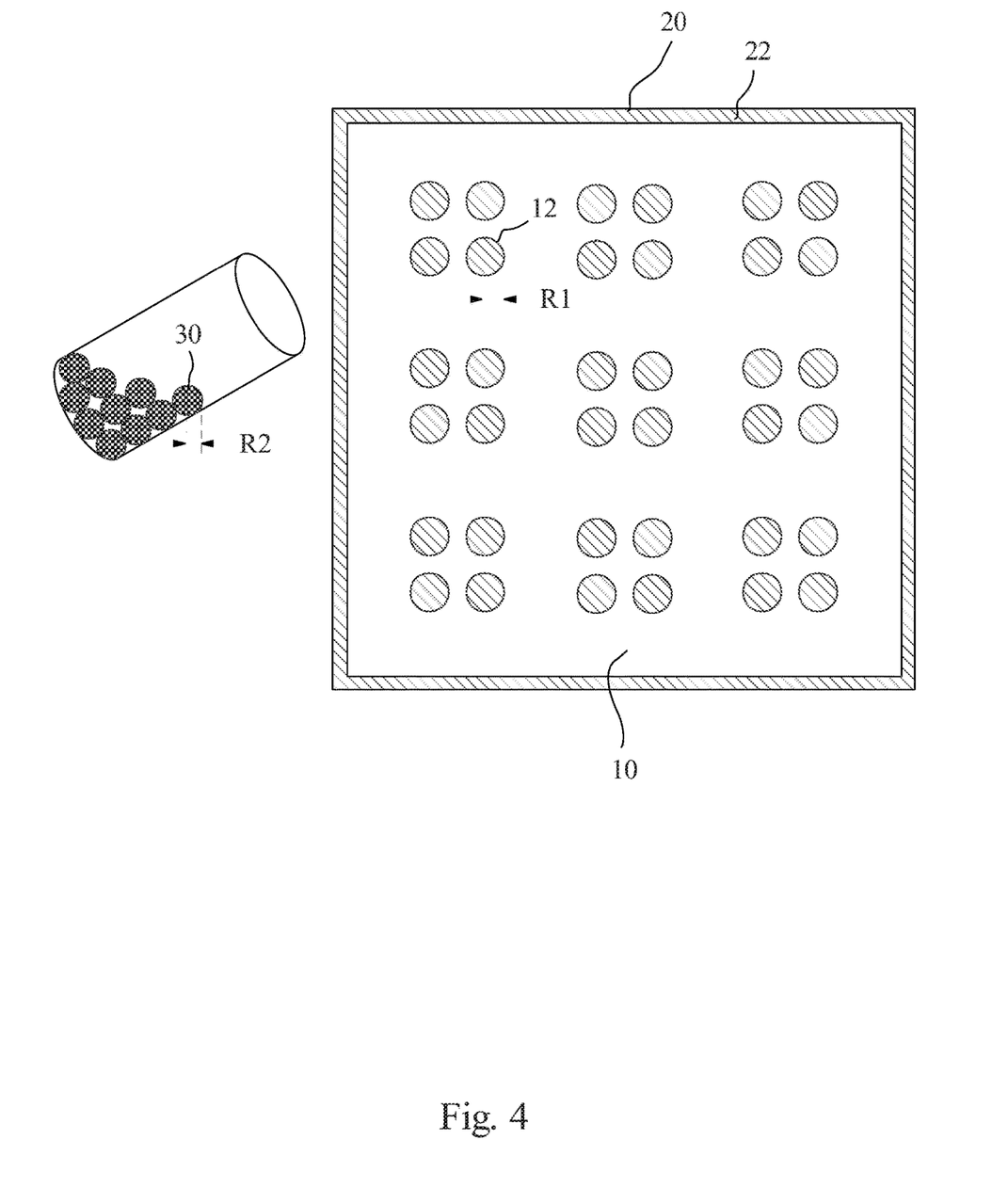
FIG. 4 is a diagram schematically showing that metal balls are poured onto a TGV substrate according to one embodiment of the present invention.
Figure 5:
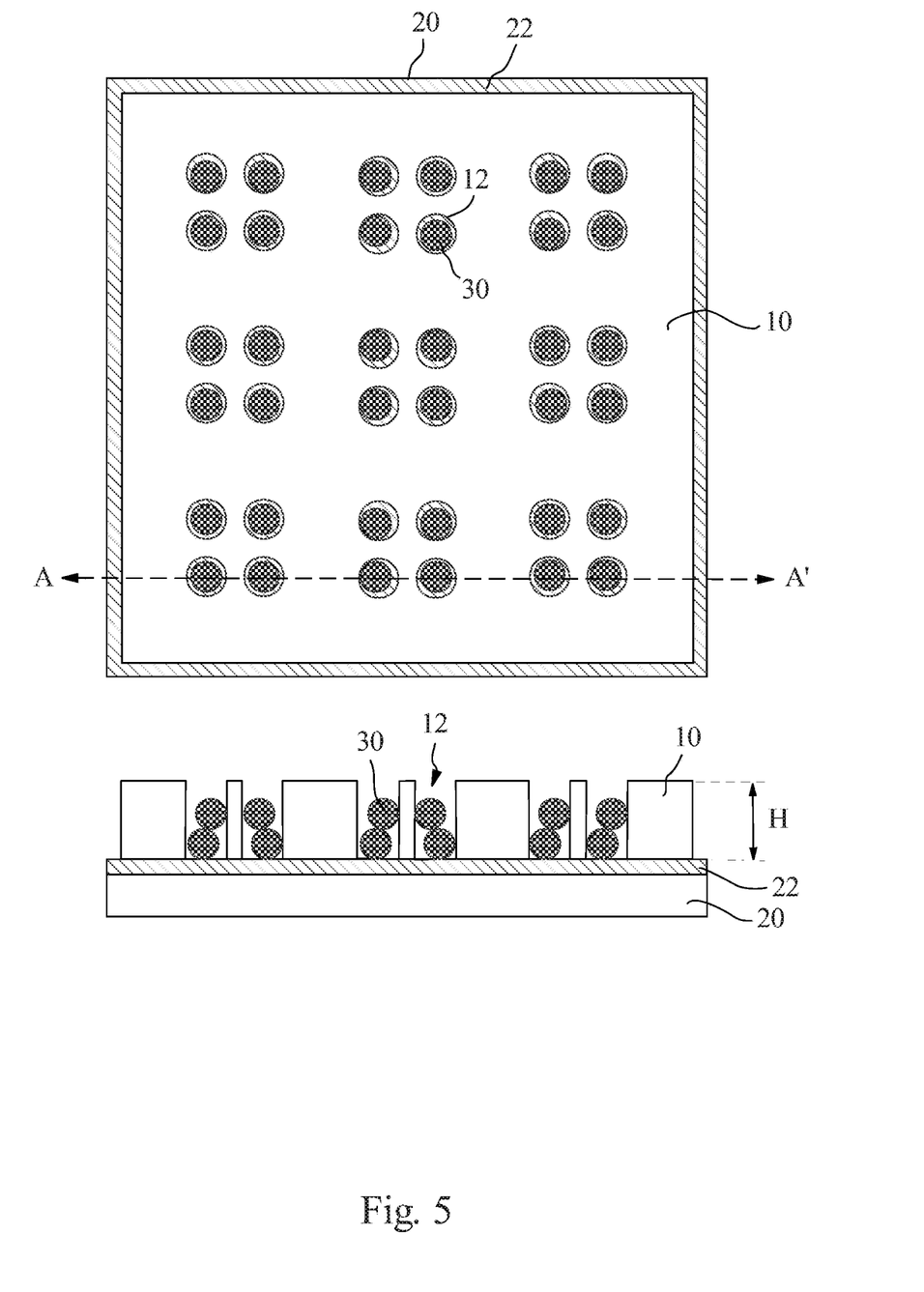
FIG. 5 includes a top view and a sectional view schematically showing that metal balls are filled into the vias of a TGV substrate according to one embodiment of the present invention.

After the TGV substrate 10 has been placed on the fixture 20, fill a plurality of metal balls 30 into the plurality of vias 12 of the TGV substrate 10, as shown in FIG. 4 and FIG. 5, wherein the plurality of metal balls 30 is poured onto the TGV substrate 10 firstly (as shown in FIG. 4), and then the fixture 20 is slightly vibrated or swung to make the metal balls 30 roll and fall into the vias 12 (as shown in FIG. 5). In FIG. 5, the upper drawing is a top view of the TGV substrate 10 and the fixture 20, and the lower drawing is a sectional view taken along Line AA' in the top view. There are many methods to fill the meal balls 30 into the vias 12, and the method shown in FIG. 4 and FIG. 5 is only one of them. In the embodiment shown in FIG. 4 and FIG. 5, the height and radius of the via 12 are respectively H and R1, and the radius of each metal ball 30 is R2, wherein the height H of the via 12 is exactly the thickness of the TGV substrate 10 and the radius R1 of the via 12 is greater than or equal to the radius R2 of the metal ball 30. The volume of each via 12 is $H \times \pi \times R1^2$, and the volume of each metal ball 30 is $(4/3) \times \pi \times R2^3$, wherein $\pi$ is the circular ratio. In the present invention, the remainder of the volume of the via 12 divided by the volume of the metal ball 30 is expected to approach zero as much as possible. In other words, it is the optimized condition: the volume of each via 12 is an integer multiple of the volume of each metal ball 30. In the case that the height H and the radius R1 of the via 12 have been known, an appropriate radius R2 of the metal ball 30 can be designed. In one embodiment, the height H and the diameter D1 of the via 12 (D1=2×R1) are respectively 200 μm and 125 μm and the diameter D2 of the metal ball 30 (D2=2×R2) is 105 μm.

Figure 6:
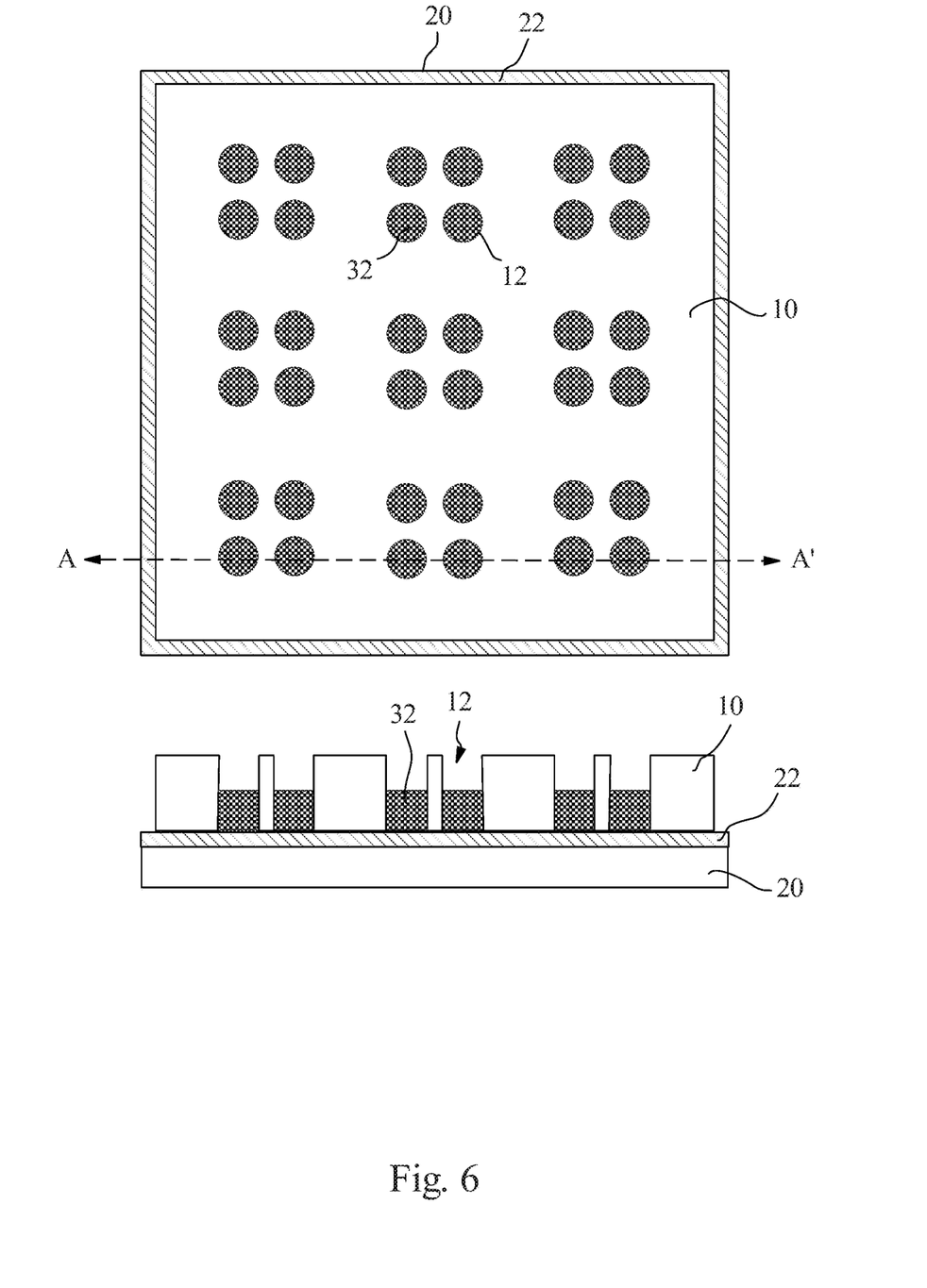
FIG. 6 includes a top view and a sectional view schematically showing that metal balls are melted and then cooled down to form a solid-state metal according to one embodiment of the present invention.

After a plurality of metal balls 30 has been filled into the plurality of vias 12 of the TGV substrate 10, perform a heating process on the plurality of metal balls 30 inside the vias 12 to melt the metal balls 30 to form a liquid-state metal. After the plurality of metal balls 30 has been completely liquidized, perform a cooling process to cool down the liquid-state metal inside the plurality of vias 12 and generate a solid-state metal 32, as shown in FIG. 6.

In one embodiment, the heating process includes a reflow process. The reflow process includes a first heating stage, an isothermal stage, and a second heating stage. The reflow process heats the entire TGV substrate 10. In the first heating stage, the temperature of the TGV substrate 10 is raised from a first temperature to a second temperature at a heating rate of 1-2° C. per second. After the TGV substrate 10 has reached the second temperature, the process terminates the first heating stage and enters the isothermal stage. In the isothermal stage, the process maintains the TGV substrate 10 at the second temperature. After the isothermal stage is terminated, the process enters the second heating stage. In the second heating stage, the temperature of the TGV substrate 10 is raised from the second temperature to a third temperature at a heating rate of 1-2° C. per second. Once the TGV substrate 10 reaches the third temperature, the reflow process is terminated. In one embodiment, the first temperature may be but is not limited to be 25° C., the second temperature may be but is not limited to be 180° C., and the third temperature may be but is not limited to be 230° C.

In one embodiment, the heating process includes a laser heating process. The laser heating process uses a laser beam to irradiate the plurality of metal balls 30 and melt the plurality of metal balls 30. In general, a laser beam can only irradiate a local region of the TGV substrate 10. Therefore, the laser heating process lets the laser beam irradiate a plurality of regions of the TGV substrate 10 in sequence to melt the metal balls 30 inside all the vias 12. In one embodiment, the laser heating process uses a laser beam with a power of 6-8 W, and each region of the TGV substrate 10 is irradiated by the laser beam for 5-9 seconds.

In comparison with the conventional sintering process, the reflow process or the laser heating process, which is used by the present invention, can reduce the heating time. Thus, the present invention can decrease the probability of damaging the TGV substrate 10 during heating.

Figure 7:
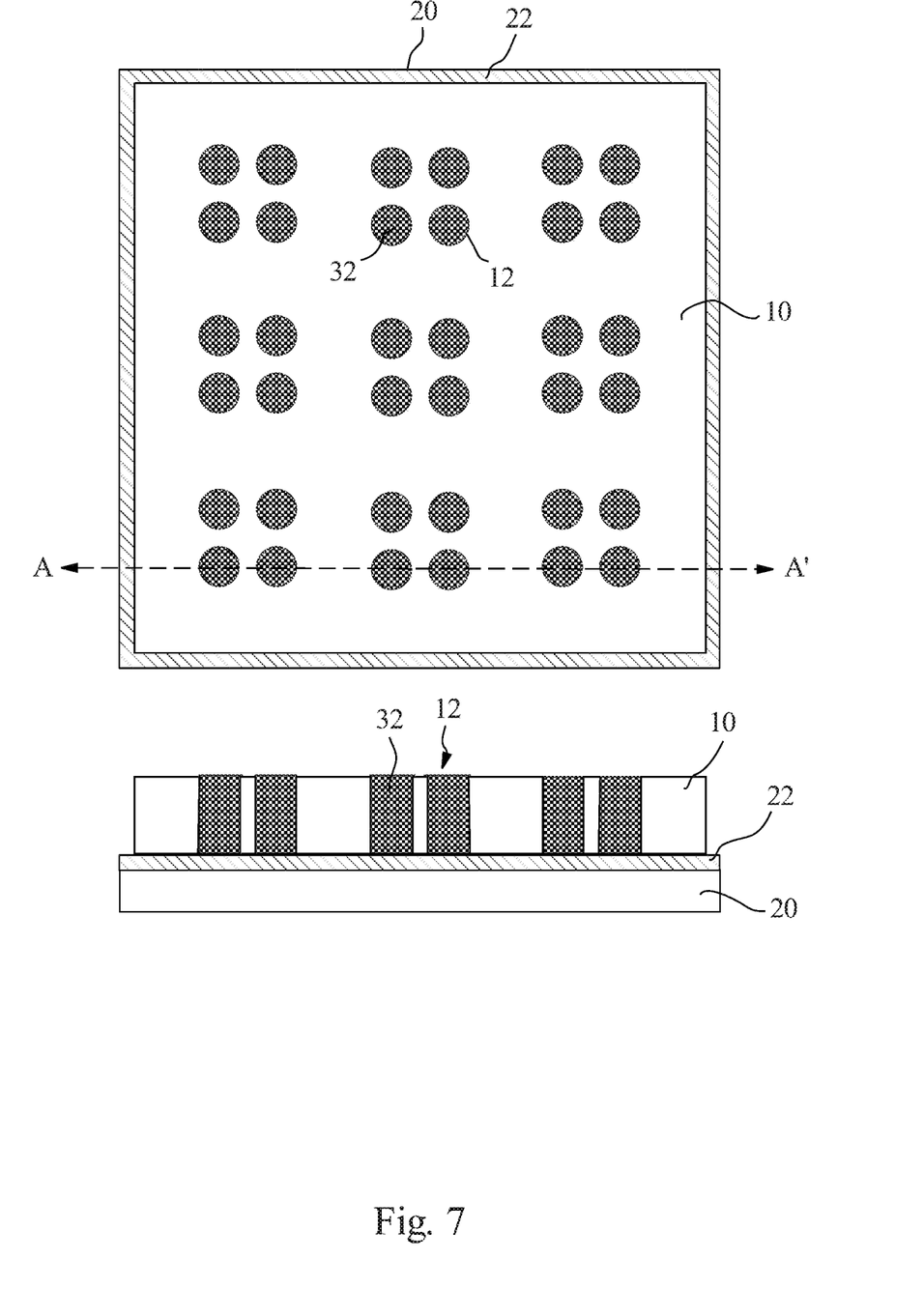
FIG. 7 includes a top view and a sectional view schematically showing that vias are fully filled by a solid-state metal according to one embodiment of the present invention.
Figure 8:
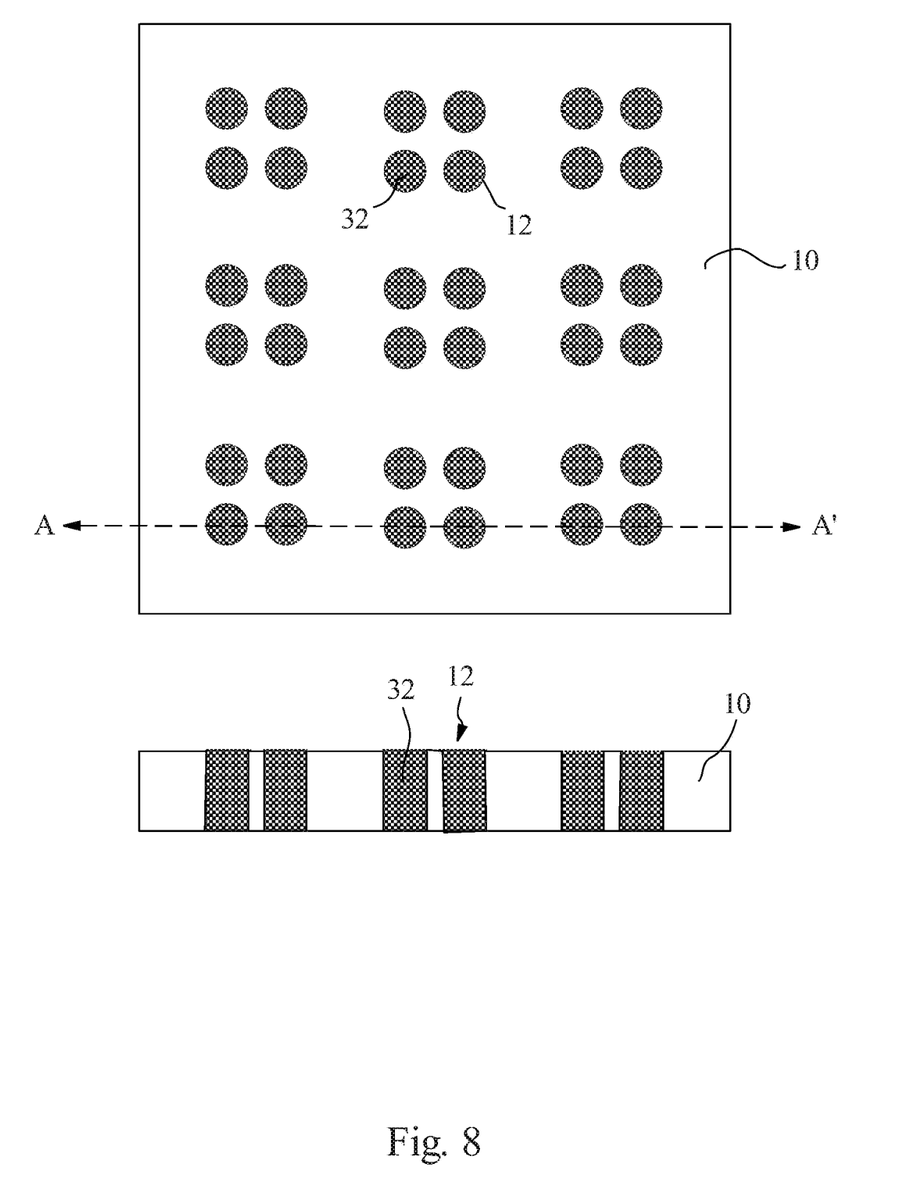
FIG. 8 includes a top view and a sectional view schematically showing that a TGV substrate whose vias are fully filled according to one embodiment of the present invention.

If the solid-state metal 32 inside the vias 12 of the TGV substrate 10 have not fully filled yet (as shown in FIG. 6), the steps shown in FIGS. 4-6 are repeated until all the vias 12 of the TGV substrate 10 have been fully filled by the solid-state metal, as shown in FIG. 7. After all the vias 12 of the TGV substrate 10 have been fully filled by the solid-state metal, a cleaning agent is used to clean the surface of the TGV substrate 10, wherein the cleaning agent may be but is not limited to alcohol. After cleaning, the TGV substrate 10 is removed from the fixture 20, and the via-filling process of the TGV substrate 10 is completed, as shown in FIG. 8. In comparison with the conventional via-filling technology that fills vias with metal paste, the present invention is characterized in filling the vias 12 with solid-state metal balls and then melting the metal balls. Therefore, the present invention needn't use a solvent or a flux, exempts the solid-state metal 32 from pores, and enhances the electric conductivity of the solid-metal 32.

Figure 9:
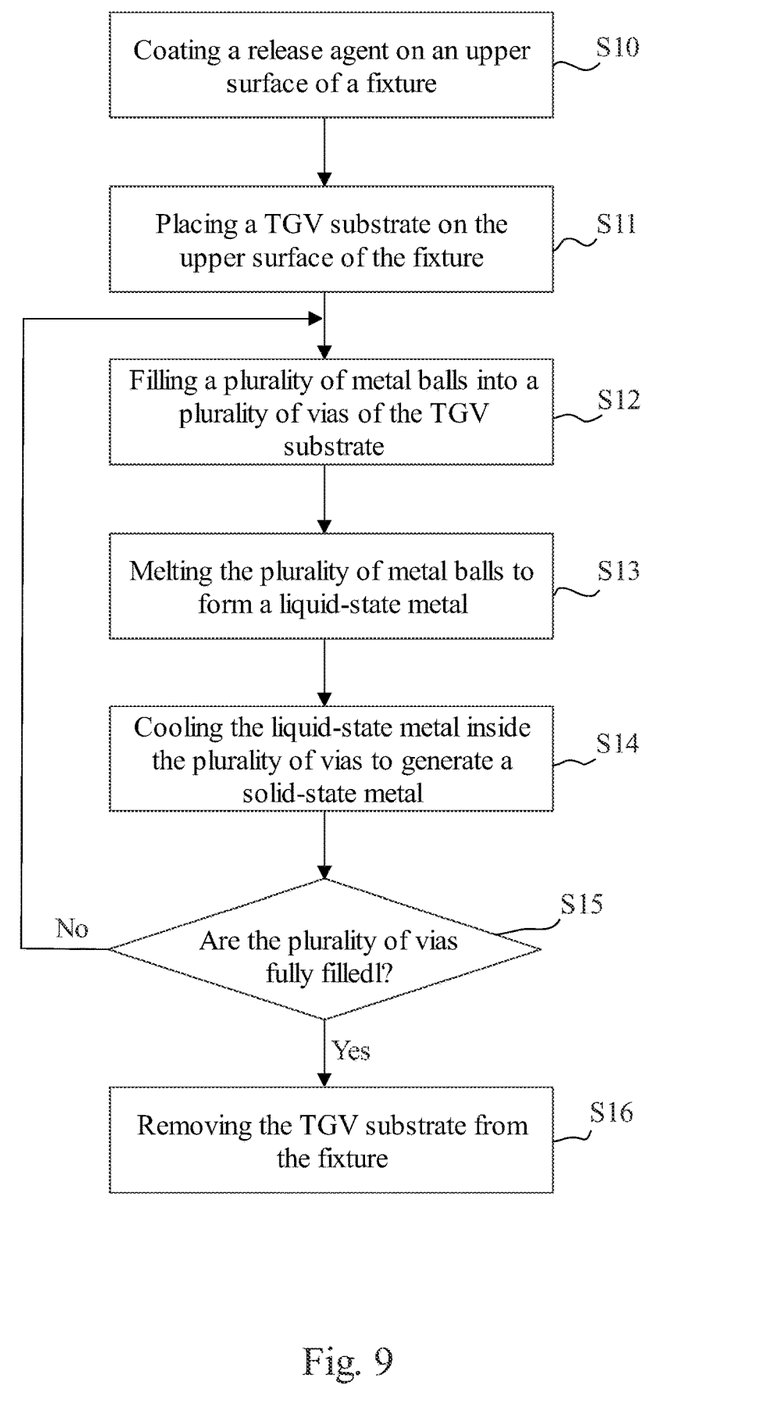
FIG. 9 is a flowchart of a via-filling method of a TGV substrate according to one embodiment of the present invention.

From the above description, it is learned: the via-filling method of a TGV substrate of the present invention can be expressed by FIG. 9 and comprises:

Step S10: coating a release agent on the upper surface pf a fixture;

Step S11: placing a TGV substrate on the upper surface of the fixture;

Step S12: filling a plurality of metal balls into a plurality of vias of the TGV substrate;

Step S13: melting the plurality of metal balls to form a liquid-state metal;

Step S14: cooling the liquid-state metal inside the plurality of vias to generate a solid-state metal;

Step S15: determining whether the plurality of vias are fully filled by the solid-state metal; if no, repeating Steps S12-S14; if yes, proceeding to Step S16; and Step S16: cleaning the surface of the TGV substrate, and removing the TGV substrate from the fixture.

The embodiments described above are only to exemplify the present invention but not to limit the scope of the present invention. Through making some modification or variation according to the technical contents disclosed in the specification and claims, any person having ordinary knowledge of the art should be able to generate equivalent embodiments without departing from the present invention. Further, the equivalent embodiments are to be included by the scope of the present invention.

What is claimed is:

1. A via-filling method of a Through-Glass Via (TGV) substrate, comprising:
   Step A: coating a release agent on an upper surface of a fixture;
   Step B: placing the TGV substrate on the upper surface of the fixture, wherein the TGV substrate has a plurality of vias;
   Step C: filling a plurality of metal balls into the plurality of vias;
   Step D: melting heating the plurality of metal balls to melt the plurality of metal balls to form a liquid-state metal;
   Step E: cooling the liquid-state metal inside the plurality of vias to generate a solid-state metal;
   Step F: repeating Steps C-E until the plurality of vias is fully filled by the solid-state metal; and
   Step G: cleaning a surface of the TGV substrate, and removing the TGV substrate from the fixture;
   wherein in Step D the heating includes a reflow process comprises a first heating stage, a second heating stage to raise a temperature of the TGV substrate and an isothermal stage, arranged between the first heating stage and the second heating stage to maintain the temperature of the TGV substrate.

2. The via-filling method according to claim 1, wherein the reflow process further comprises:
   a first heating stage: raising the temperature of the TGV substrate from a first temperature to a second temperature at a rate of 1 to 2 degrees per second in the first temperature stage; and
   a second heating stage: raising the temperature of the TGV substrate from the second temperature to a third temperature at a rate of 1 to 2 degrees per second in the second temperature stage.

3. The via-filling method according to claim 2, wherein the reflow process further comprises: an isothermal stage, arranged between the first heating stage and the second heating stage, wherein in the isothermal stage, the temperature of the TGV substrate is maintained at the second temperature.

4. The via-filling method according to claim 2, wherein the first temperature is 25° C., the second temperature is 180° C., and the third temperature is 230° C.

5. The via-filling method according to claim 1, wherein in Step D the heating further comprises a step: using a laser heating process to melt the plurality of metal balls.

6. The via-filling method according to claim 5, wherein the laser heating process uses a laser beam with a power of 6-8 W to irradiate a plurality regions of the TGV substrate in sequence to melt the plurality of metal balls, wherein each of the plurality of regions is irradiated by the laser beam for 5-9 seconds.

7. The via-filling method according to claim 1, wherein a volume of each of the plurality of vias is an integer multiple of a volume of each of the plurality of metal balls.

8. The via-filling method according to claim 1, wherein a height of each of the plurality of vias and a diameter of each of the plurality of vias are respectively 200 μm and 125 μm, and a diameter of each of the plurality of metal balls is 105 μm.

\* \* \* \* \*